United States Patent
Kamal et al.

(10) Patent No.: US 9,053,960 B2
(45) Date of Patent: Jun. 9, 2015

(54) DECOUPLING CAPACITOR FOR INTEGRATED CIRCUIT

(71) Applicant: QUALCOMM Incorporated, San Diego, CA (US)

(72) Inventors: Pratyush Kamal, San Diego, CA (US); Mukul Gupta, Los Angeles, CA (US); Foua Vang, Lemon Grove, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/784,811

(22) Filed: Mar. 4, 2013

(65) Prior Publication Data

US 2014/0246715 A1  Sep. 4, 2014

(51) Int. Cl.
| | |
|---|---|
| *H01L 27/07* | (2006.01) |
| *H01L 27/08* | (2006.01) |
| *H01L 29/66* | (2006.01) |
| *H01L 27/01* | (2006.01) |
| *H01L 29/94* | (2006.01) |

(52) U.S. Cl.
CPC ...... *H01L 27/0811* (2013.01); *H01L 29/66181* (2013.01); *H01L 27/016* (2013.01); *H01L 29/94* (2013.01)

(58) Field of Classification Search
CPC ............ H01L 27/0805; H01L 27/0629; H01L 27/0207; H01L 23/5223; H01L 22/34; H01L 28/40

USPC .......................................... 257/222, 296, 532
See application file for complete search history.

(56) References Cited

U.S. PATENT DOCUMENTS

| | | | |
|---|---|---|---|
| 5,469,195 | A | 11/1995 | Yung et al. |
| 7,202,726 | B2 | 4/2007 | Kunanayagam et al. |
| 7,508,696 | B2 | 3/2009 | Komaki |
| 8,134,824 | B2 | 3/2012 | Frederick, Jr. et al. |
| 8,487,696 | B2 * | 7/2013 | Hsu et al. ...................... 327/581 |
| 2006/0124972 | A1 * | 6/2006 | Booth et al. .................. 257/222 |
| 2009/0207552 | A1 * | 8/2009 | Frederick et al. .......... 361/306.2 |
| 2011/0148466 | A1 * | 6/2011 | Aton .............................. 326/103 |
| 2011/0157962 | A1 * | 6/2011 | McElroy et al. .............. 365/149 |

FOREIGN PATENT DOCUMENTS

JP        2008258538 A    10/2008

* cited by examiner

*Primary Examiner* — David Vu
*Assistant Examiner* — Jonathan Han
(74) *Attorney, Agent, or Firm* — Arent Fox LLP

(57) ABSTRACT

An integrated circuit includes a capacitor having first, second and third nodes. The first and second nodes of the first transistor are connected together and the first and second nodes of the second transistor are connected together. The third node of the first transistor is connected to the third node of the second transistor. Each of the third nodes is constructed so that each node comprises a width and a length that is at least ten percent of the width.

8 Claims, 9 Drawing Sheets

DECOUPLING CAPACITOR FOR INTEGRATED CIRCUIT

BACKGROUND

1. Field

The present disclosure relates generally to electronics, and more particularly, to decoupling capacitors for integrated circuits.

2. Background

In semiconductor design, standard cell methodology typically involves designing integrated circuits having various functionality using standard components and interconnect structures. These activities are typically facilitated within a computer-aided design environment. Standard cell methodology uses abstraction wherein low level integrated circuit synthesis is replaced by a more abstract, higher-level functional representation. Cell-based methodologies allow one designer to focus on the high-level aspect of design, while another designer focuses on the physical implementation.

The physical implementation of the integrated circuit or "chip," begins with the standard cell. The standard cell is generally organized in layers with transistors being formed in the lower layers and interconnects formed above. A large number of these cells are then distributed across the chip and interconnected to provide operational functionality. Typically, the cells have a constant lateral dimension which allows them to be arranged in rows. Together, these rows form the core of the chip. The core is surrounded by a number of larger cells arranged along the periphery of the chip. The larger cells contain input/output (I/O) drivers formed with transistors having wider channel lengths, thicker oxide layers, and higher threshold voltages to interface with higher voltage off-chip devices.

The cells that make up the core are distributed on the chip using a standard automation tool. Due to various design rules imposed by the foundry, various sections within the core may lack a functioning cell. These sections are sometimes referred to as "white space." Decoupling capacitors are often used in the white space to improve noise performance. In the past, decoupling capacitors have been implemented using MOS transistors designed for I/O drivers.

In order to meet the increasing demand for smaller and more powerful devices, the semiconductor industry continues to evolve to smaller process geometries. Today, the size of the standard cell has been reduced using 20 nm or smaller geometry technology. This technology, however, presents certain challenges when attempting to provide decoupling in the white space of the core. The MOS capacitors designed for I/O drivers no longer meet the requirements of the smaller geometries being implemented in the core. Smaller geometry MOS capacitors cannot be used as decoupling capacitors due to high leakage current and electrostatic discharge (ESD) concerns. Accordingly, there is a need in the art for smaller geometry decoupling capacitors configured to have low leakage current with reduced ESD concerns.

SUMMARY

In one aspect of the disclosure, an integrated circuit includes a capacitor having first, second and third nodes. The first and second nodes of the first transistor are connected together and the first and second nodes of the second transistor are connected together. The third node of the first transistor is connected to the third node of the second transistor. Each of the third nodes is constructed so that each node has a width and a length that is at least ten percent of the width.

In another aspect of the disclosure, an integrated circuit includes one or more logic functions, and decoupling means for decoupling the one or more logic functions.

In a further aspect of the disclosure, a method of manufacturing an integrated circuit includes partitioning the integrated circuit into a plurality of core cells arranged in rows, each of the cells having the same lateral dimension, forming in each of one or more of the cells a plurality of transistors interconnected to perform a logic function, and forming in another one or more of the cells a capacitor including first and second transistors each having first, second and third nodes, wherein the forming of the capacitor further comprises connecting first and second nodes of the first transistor together, connecting the first and second nodes of the second transistor together, and connecting the third node of the first transistor to the third node of the second transistor, and wherein each of the third nodes comprises a width and a length that is at least ten percent of the width.

In yet a further aspect of the disclosure, a method of decoupling one or more logic functions on an integrated circuit includes decoupling the one or more logic functions with a capacitor. The capacitor includes first and second transistors each having first, second and third nodes. The first and second nodes of the first transistor are connected together and the first and second nodes of the second transistor are connected together. The third node of the first transistor is connected to the third node of the second transistor. Each of the third nodes comprises a width and a length that is at least ten percent of the width.

It is understood that other aspects of apparatus and methods will become readily apparent to those skilled in the art from the following detailed description, wherein various aspects of apparatuses, methods and articles of manufacture are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1A:
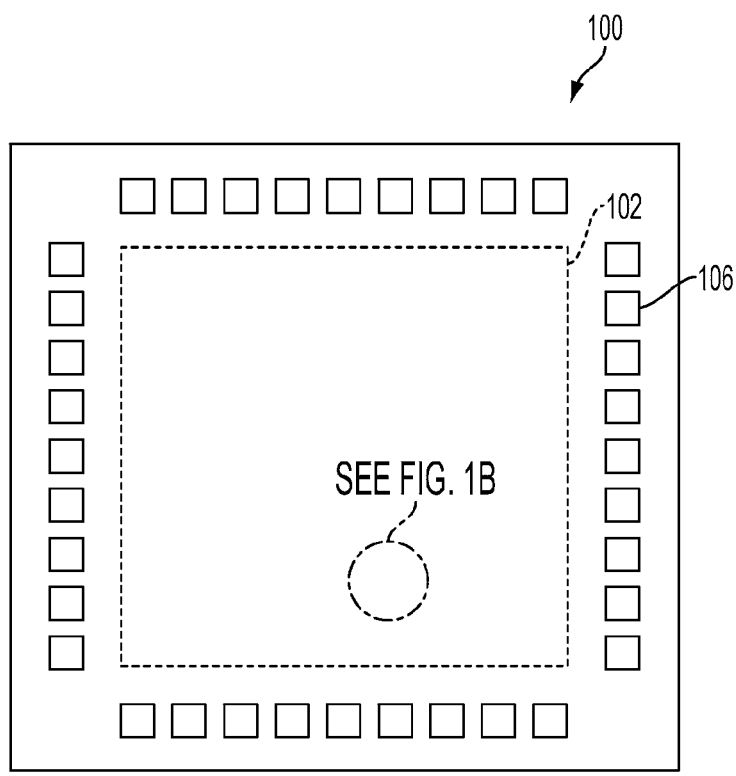
FIG. 1A is a schematic plan view illustrating an example of an integrated circuit.

Various aspects of the disclosure will be described more fully hereinafter with reference to the accompanying drawings. This disclosure may, however, be embodied in many different forms by those skilled in the art and should not be construed as limited to any specific structure or function presented herein. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of this disclosure, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of this disclosure. It should be understood that any aspect of the disclosure disclosed herein may be embodied by one or more elements of a claim.

Although particular aspects will be described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different circuits, technologies, systems, networks, and methods, some of which are illustrated by way of example in the figures and in the following description. The detailed description and drawings are merely illustrative of the disclosure rather than limiting, the scope of the disclosure being defined by the appended claims and equivalents thereof.

The various circuits described throughout this disclosure may be implemented in various forms of hardware. By way of example, any of these circuits, either alone or in combination, may be implemented as an integrated circuit, or as part of the design of an integrated circuit. The integrated circuit may be an end product, such as a microprocessor, a digital signal processor (DSP), an application specific integrated circuit (ASIC), programmable logic, memory, or any other suitable integrated circuitry. Alternatively, the integrated circuit may be integrated with other chips, discrete circuit elements, and/or other components as part of either an intermediate product, such as a motherboard, or an end product. The end product can be any suitable product that includes integrated circuits, including by way of example, a cellular phone, a personal digital assistant (PDA), laptop computer, a desktop computer (PC), a computer peripheral device, a multimedia device, a video device, an audio device, a global positioning system (GPS), a wireless sensor, or any other suitable device.

Figure 1B:
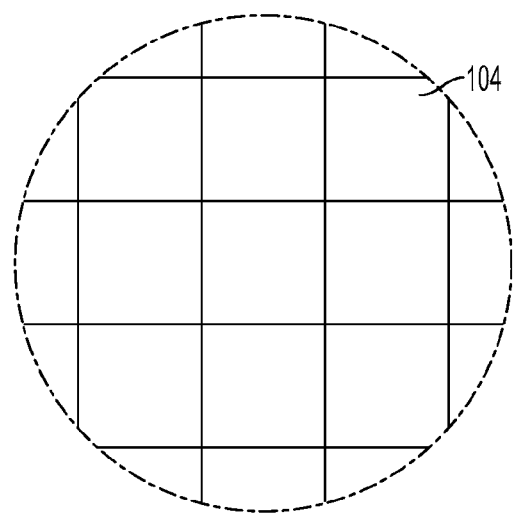
FIG. 1B is a partially enlarged view of the integrated circuit shown in FIG. 1A.

FIG. 1A is a schematic plan view illustrating an example of an integrated circuit. FIG. 1B is a partially enlarged view of the integrated circuit shown in FIG. 1A. The integrated circuit 100 is formed on a rectangular chip. The integrated circuit 100 is shown with a core 102 formed from an array of cells 104. The cells 104 implement various logic functions. The logic functions are interconnected together to form a functioning semiconductor device. Decoupling capacitors may be used in the white space to improve noise performance. The core 102 is surrounded by a number of larger cells 106 arranged along the periphery of the chip. These cells 106 contain I/O drivers which provide an interface between the core 102 and off-chip devices (not shown).

Various aspects of a decoupling capacitor for the core of an integrated circuit will now be presented. These aspects are particularly well suited to support 20 nm technologies, as well as smaller geometries. In one embodiment, the decoupling capacitor may be constructed from one or more small CMOS capacitors that fit into one or more cells within a row of cells in the core. More specifically, the CMOS capacitors may be designed to meet the lateral cell dimensional requirements for increasingly smaller technologies. The CMOS capacitors may be contained within a single cell or span multiple cells within the row, but the lateral cell dimension required by the technology is satisfied. In some embodiments, the CMOS capacitors may be connected to other parallel arrangements of CMOS capacitors to provide increased decoupling capability. The other parallel arrangement of CMOS capacitors may be located in other white space locations throughout the core. Those skilled in the art will be well suited to determine the appropriate arrangement to meet the decoupling requirements of an integrated circuit for any particular application or design.

Figure 2:
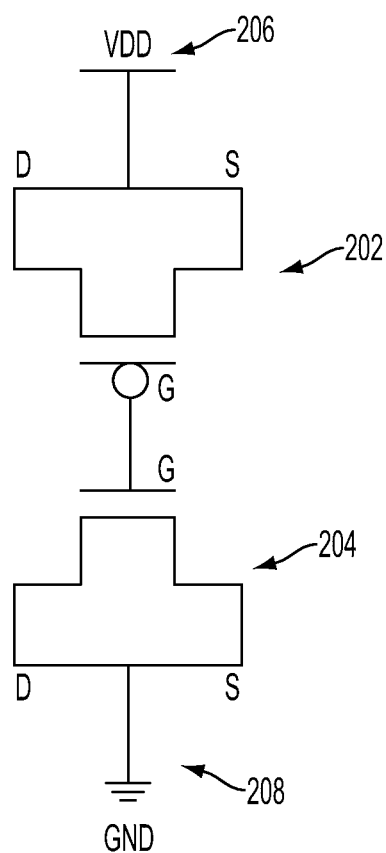
FIG. 2 is a schematic diagram illustrating an example of a decoupling capacitor.

FIG. 2 is a schematic diagram illustrating an example of a decoupling capacitor. The decoupling capacitor may be formed with a p-channel transistor 202 and an n-channel transistor 204. In this example, the p-channel transistor 202 has its source and drain tied to the power rail 206 and the n-channel transistor 208 has its source and drain tied to the power return rail (e.g., ground) 208. The gates of the transistors 202, 204 are tied together. This configuration enables small geometry decoupling capacitors. Unlike I/O decoupling capacitors with wide channel lengths, thick oxide layers, and high threshold voltages, the disclosed decoupling capacitor can be formed with similar geometries to the logic functions in adjacent cells. The disclosed decoupling capacitor has lower leakage current and is less susceptible to breakdown because the power supply voltage is applied across a pair of transistors rather than a single transistor as is commonly the practice with I/O capacitors.

The parasitic capacitance of the decoupling capacitor may be used to increase the capacitance. The parasitic capacitance may be increased during the manufacture of the integrated circuit. An example will now be presented. However, as those skilled in the art will readily understand, the parasitic capacitance may be increased in different ways. Accordingly, the disclosure embodiments should not be construed or limited to any particular methodology or structure for increasing the parasitic capacitance.

The decoupling capacitor may be formed on an integrated circuit through a series of processing steps. Various steps in this process will now be presented. However, as those skilled in the art will readily appreciate, numerous intermediate steps may also be required to manufacture the decoupling capacitor. These steps have been omitted for clarity.

Figure 3:
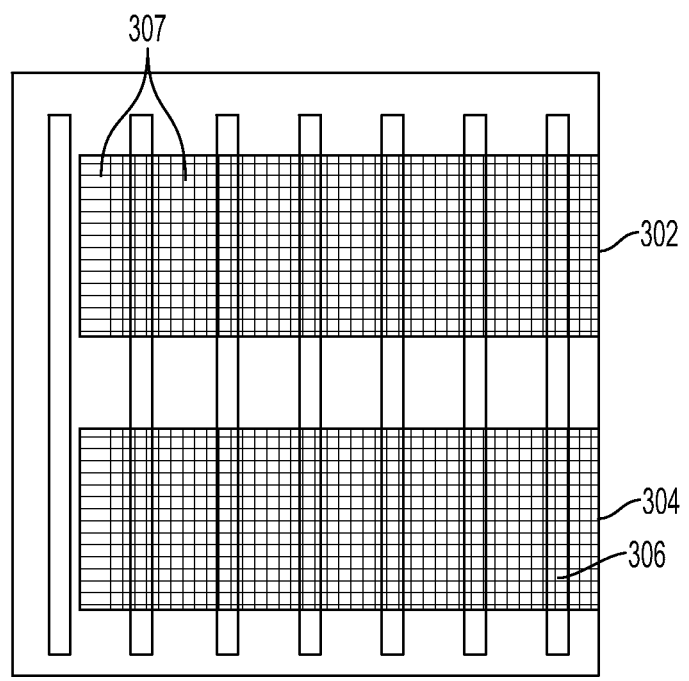
FIG. 3 is a layout diagram illustrating an example of a base layer on an integrated circuit where the transistors are formed.

The process begins with the formation of the transistors directly in the semiconductor chip. FIG. 3 is a layout diagram illustrating an example of a base layer on an integrated circuit. The base layer is shown with a p-channel active region 302 and an n-channel active region 304. The active regions are formed in the semiconductor material using processes that are well known in the art. Next, a series of horizontally spaced apart gates 306 are formed on the semiconductor material by means also well known in the art. Each gate 306 extends vertically through the p-channel and n-channel active regions 302, 304. The result is a number of p-channel and n-channel transistor pairs with each pair having their gates connected together. The gates may be formed from polysilicon or other suitable material.

Once the gates 306 have been formed over the active regions, the source/drain regions 307, are connected to power and power return (e.g., ground) to form the decoupling capacitors. This may be achieved with a series of conductive posts or pillars that extend from the source/drain regions 307 and connect to power or power return. Alternatively, the source/drain regions 307 may be connected to power and power return through multiple layers of conductors designed to increase the parasitic capacitance of the decoupling capacitor. An example of a multi-layered conductor will now be presented. The described embodiment of the multi-layered conductor provides a means for connecting the source and drain of the p-channel transistors to power and connecting the source and drain of the n-channel transistors to power return.

Figure 4:
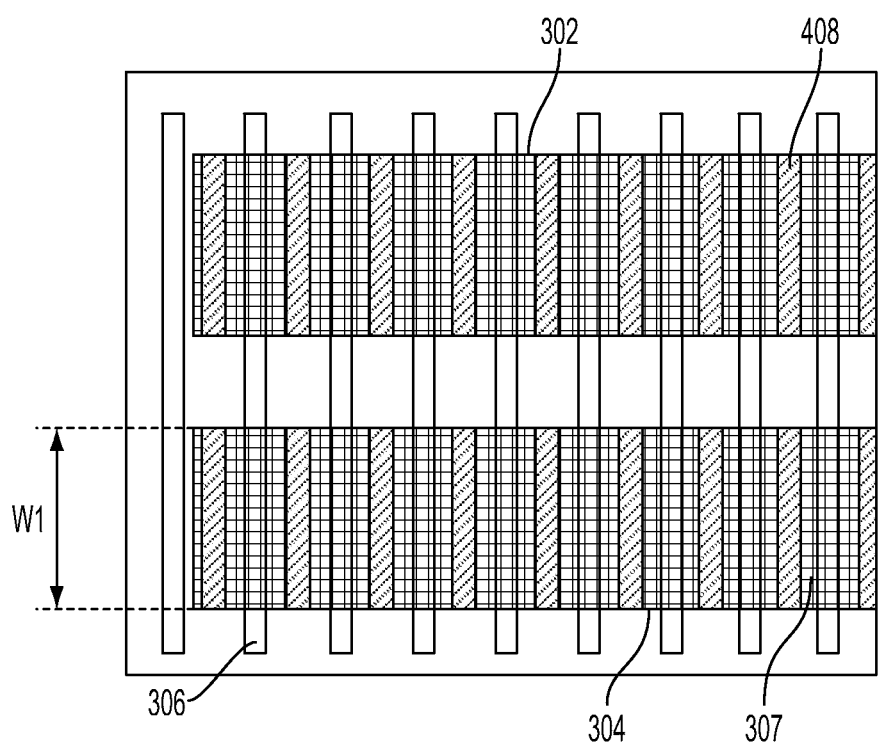
FIG. 4 is a layout diagram illustrating an example of a first conductive layer formed on the base layer shown in FIG. 3.

FIG. 4 is a layout diagram illustrating an example of a first conductive layer formed on the base layer. The first conductive layer, which is sometimes referred to in the art as the MD1 layer, may be patterned to form an elongated conductor 408 over each of the source/drain regions 307.

Figure 5:
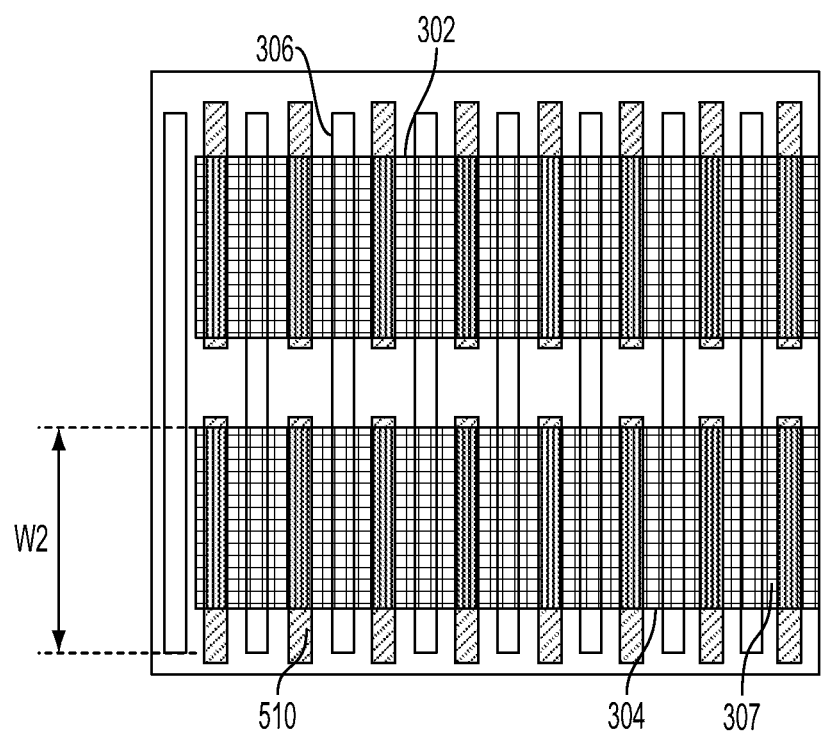
FIG. 5 is a layout diagram illustrating an example of a second conductive layer formed on the first conductive layer shown in FIG. 4.

FIG. 5 is a layout diagram illustrating an example of a second conductive layer formed on the first conductive layer. The second conductive layer, which is sometimes referred to as the MD2 layer, may be patterned to form an elongated conductor 510 over each of the first layer conductors. In the described embodiment, the second layer conductors have a width $W_2$ that is greater than the width $W_1$ (see FIG. 4) of the first layer conductors, which contributes to the parasitic capacitance of the decoupling capacitor.

Figure 6A:
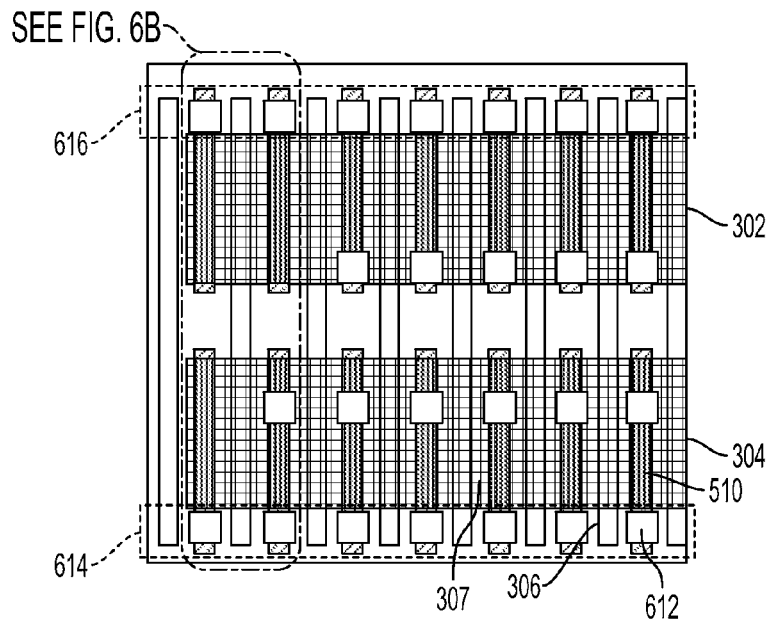
FIG. 6A is a layout diagram illustrating an example of an interconnect layer formed on the second conductive layer shown in FIG. 5.

An interconnect layer may then be formed on the conductive layers to provide connections to power and power return. FIG. 6A is a layout diagram illustrating an example of an interconnect layer. The interconnect layer, which is sometimes referred to as the VO layer, is patterned with a series of interconnects 612 to connect the source/drain regions 307 for the p-channel transistors to power by connecting the second layer conductors 510 to the power rail 614. The interconnect layer is also patterned with another series of interconnects 612 used to connect the source/drain regions 307 for the n-channel transistors to power return by connecting the second layer conductors 510 to the power return rail 616.

Figure 6B:
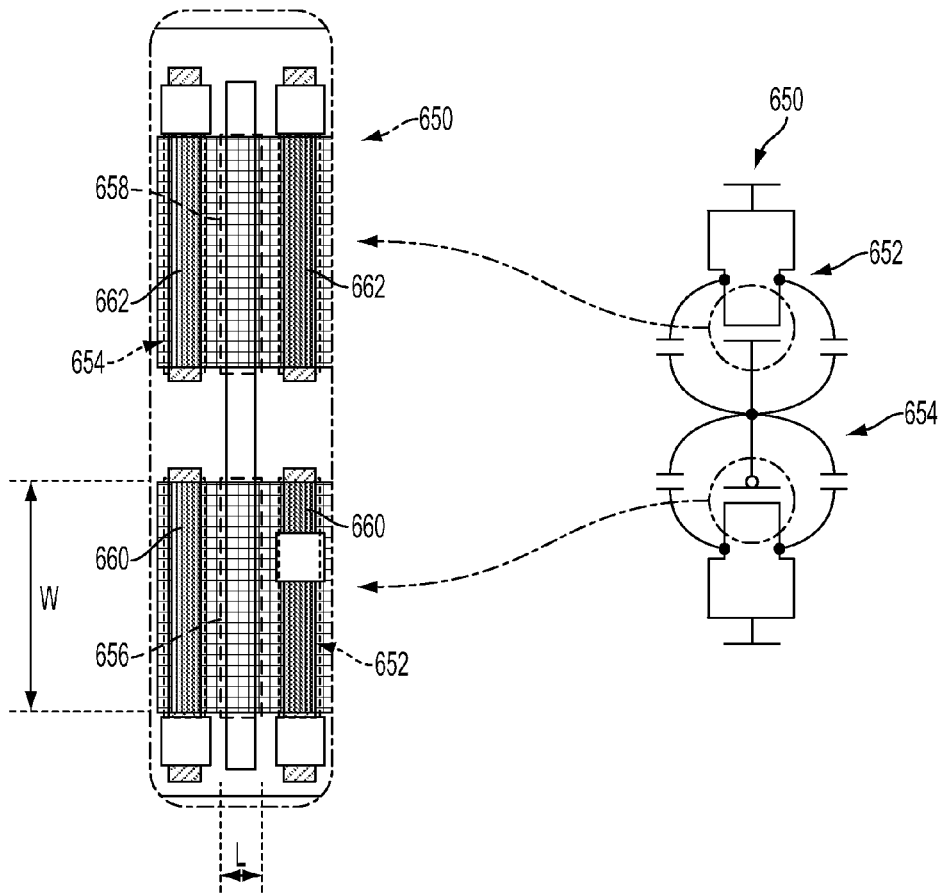
FIG. 6B is a partially enlarged view of the layout shown in FIG. 6A illustrating an example of a single decoupling capacitor.

FIG. 6B is a partially enlarged view of the layout shown in FIG. 6A illustrating an example of a single decoupling capacitor. The decoupling capacitor 650 is shown with a p-channel transistor 652 and an n-channel transistor 654. The p-channel transistor 652 includes a gate 656 with source/drain regions 660 formed on opposite sides of the gate 656. Similarly, the n-channel transistor 654 includes a gate 658 with source/drain regions 662 formed on opposite sides of the gate 658. The gates of the two transistors are connected together. The length (L) of the gate may be increased to increase the parasitic capacitance of the decoupling capacitor. In at least one embodiment, the length (L) of the gate is at least 10% of the width (W). The exact ratio of length-to-width of the gates for a transistor pair forming a decoupling capacitor will vary depending on the overall design requirements. Those skilled in the art will be best suited to determine the appropriate dimensions for any particular application.

Figure 7A:
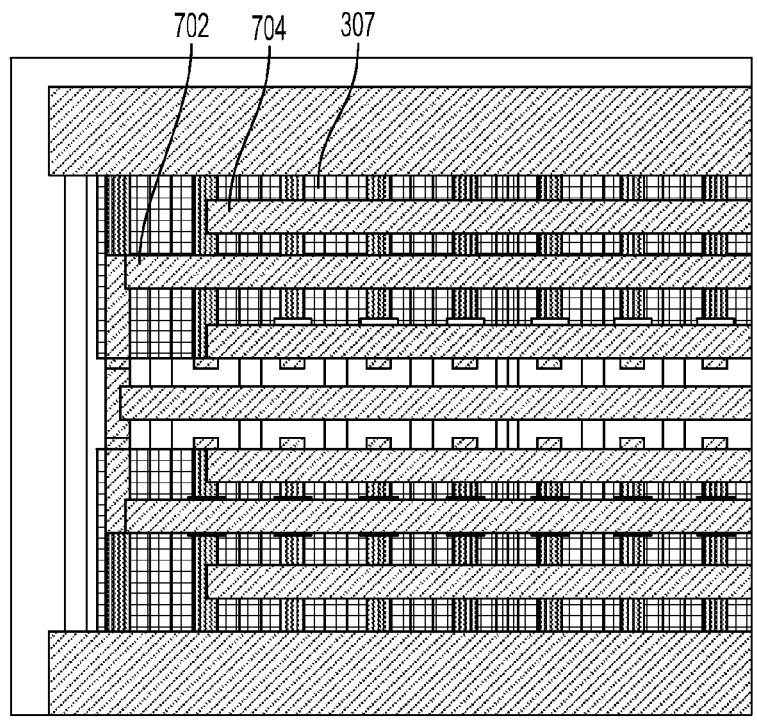
FIG. 7A is a layout diagram illustrating an example of a metal layer attached to the transistors through the interconnect layer.
Figure 7B:
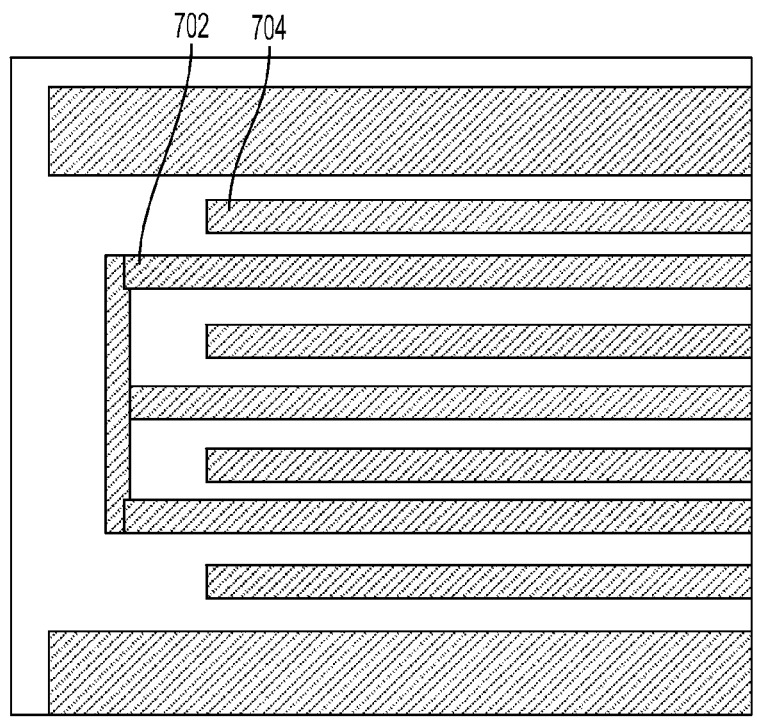
FIG. 7B is a layout diagram illustrating the metal layer of FIG. 7A.

In at least one embodiment of a decoupling capacitor, the interconnects 612 may be used to attach the transistors to a metal layer designed to further increase the parasitic capacitance. The metal layer, which is sometimes referred to as the M1 layer, is shown in FIGS. 7A and 7B. FIG. 7A is a layout diagram illustrating an example of a metal layer attached to the transistors through the interconnect layer. It illustrates an example of the layout for a series of decoupling capacitors formed in one or more cells in a row of the core, which provides a means for decoupling one or more logic functions also contained in core. FIG. 7B is a layout diagram illustrating the metal layer of FIG. 7A. The metal layer provides a means by which additional capacitance may be added to the transistors. The metal layer includes two conductor patterns with a number of interdigitated fingers. The first conductor pattern 702 is connected to the source/drain regions 307 of the p-channel transistors and the conductor pattern 704 is connected to the source/drain regions 307 of the n-channel transistors. The two conductor patterns 702, 704 have a plurality of interdigitated fingers.

Figure 8:
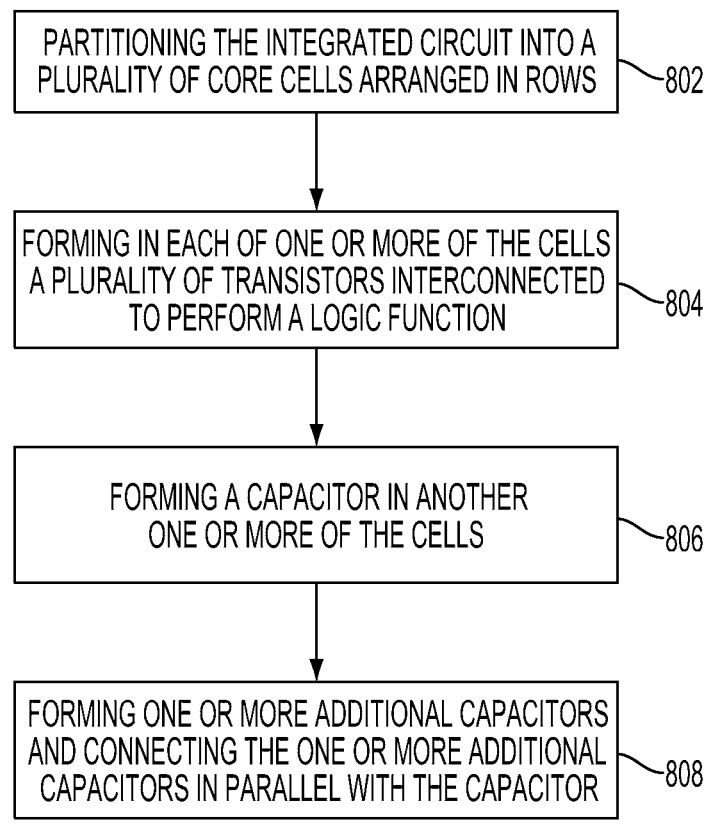
FIG. 8 is a flow diagram illustrating an example of a method of manufacturing an integrated circuit.

FIG. 8 is a flow diagram illustrating an example of a method of manufacturing an integrated circuit. In block 802, the integrated circuit is partitioned into a plurality of core cells arranged in rows, each of the cells having the same lateral dimension. In block 804, a plurality of transistors is formed in each of one or more of the cells and interconnected to perform a logic function. In block 806, a capacitor is formed in another one or more of the cells. As discussed in greater detail earlier, the capacitor may be formed from a p-channel transistor and an n-channel transistor. The source and the drain of the p-channel transistor may connected to the power rail, and the drain and source of the n-channel transistor may be connected to the power return rail. The gates of the p-channel transistor and the n-channel transistor may be connected together. Multiple conductive layers may be used to connect the p-channel and n-channels transistors to their respective rails. Increased capacitance may be realized by a first conductor pattern to the p-channel transistor and connecting a second conductor pattern to the n-channel transistor. The conductor patterns may include a number of interdigitated fingers.

In at least one embodiment, one or more additional capacitors may be formed in block 808. The one or more additional capacitors may be connected in parallel to the capacitor formed in block 802. Each of the one or more additional capacitors may have the same configuration as the capacitor just described. The parallel arrangement of capacitors may be formed in one or more cells in a single row.

Figure 9:
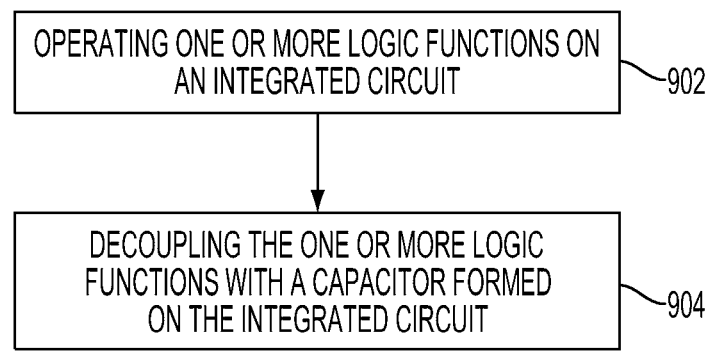
FIG. 9 is a flow diagram illustrating an example of a method of operation of an integrated circuit.

FIG. 9 is a flow diagram illustrating an example of a method of operation of an integrated circuit. In block 902, one or more logic functions are operating on an integrated circuit. In block 904, the one or more operating logic functions are decoupled with a capacitor formed on the integrated circuit.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An integrated circuit, comprising:
    a capacitor including first and second transistors each having first, second and third nodes, wherein the first and second nodes of the first transistor are connected together, the first and second nodes of the second transistor are connected together, and the third node of the first transistor is connected to the third node of the second transistor; and
    a first rail connected to the first and second nodes of the first transistor, and a second rail connected to the first and second nodes of the second transistor,
    wherein the capacitor further comprises multiple conductive layers connecting the first and second nodes of the first transistor to the first rail and connecting the first and second nodes of the second transistor to the second rail, and wherein the multiple conductive layers comprise a first conductor and a second conductor having the second conductor formed over the first conductor, wherein the first conductor has a width smaller than a width of the second conductor.

2. The integrated circuit of claim 1 wherein the first rail comprises a power rail and the second rail comprises a power return rail.

3. The integrated circuit of claim 1 wherein the first transistor comprises a p-channel transistor and the second transistor comprises an n-channel transistor.

4. The integrated circuit of claim 1 wherein each of the first nodes comprises a drain, each of the second nodes comprises a source, and each of the third nodes comprises a gate.

5. The integrated circuit of claim 1 further comprising a power rail connected to the first and second nodes of the first transistor, and a power return rail connected to the first and second nodes of the second transistor, wherein the first transistor comprises a p-channel transistor and the second transistor comprises an n-channel transistor, and wherein each of the first nodes comprises a drain, each of the second nodes comprises a source, and each of the third nodes comprises a gate.

6. The integrated circuit of claim 1 wherein the capacitor further comprises a first conductor pattern connected to the first transistor and a second conductor pattern connected to the second transistor, each of the first and second conductor patterns having a plurality of fingers, wherein the fingers of the two conductor patterns are interdigitated.

7. The integrated circuit of claim 1 further comprising one or more additional capacitors connected in parallel with the capacitor, wherein each of the one or more additional capacitors comprises additional first and second transistors each having first, second and third nodes, wherein the first and second nodes of the additional first transistor are connected together, the first and second nodes of the additional second transistor are connected together, and the third node of the additional first transistor is connected to the third node of the additional second transistor, and wherein each of the third nodes comprises a width and a length that is at least ten percent of the width.

8. The integrated circuit of claim 7 further comprising a plurality of core cells arranged in a row, each of the core cells having the same lateral dimension, and wherein the capacitor and the one or more additional capacitors fit within one or more cells in the row.

\* \* \* \* \*